United States Patent [19]

Critchlow et al.

[11] Patent Number: 5,168,507
[45] Date of Patent: Dec. 1, 1992

[54] AUTOMATIC ADAPTIVE EQUALIZER

[75] Inventors: David N. Critchlow; Graham M. Avis; Sandra J. K. Earlam, all of San Diego; Karle J. Johnson, Carlsbad; Bruce A. Smetana, Escondido; Gregory L. Westling, Poway, all of Calif.; Eric Paneth, Givataiim, Israel; Moshe Yehushua, San Diego, Calif.

[73] Assignee: International Mobile Machines Corporation, King of Prussia, Pa.

[21] Appl. No.: 433,995

[22] Filed: Nov. 9, 1989

Related U.S. Application Data

[60] Continuation of Ser. No. 256,557, Oct. 12, 1988, Pat. No. 4,881,240, which is a division of Ser. No. 893,916, Aug. 7, 1986, Pat. No. 4,825,448.

[51] Int. Cl.[5] .............................................. H03H 7/30
[52] U.S. Cl. ...................................... 375/13; 375/39; 333/18
[58] Field of Search ........................ 375/11, 12, 13, 39, 375/106, 98; 333/18, 28 R; 364/724, 825

[56] References Cited

U.S. PATENT DOCUMENTS

| | | | |
|---|---|---|---|
| 4,004,226 | 1/1977 | Qureshi et al. | 375/13 |
| 4,430,743 | 2/1984 | Watanabe | 333/18 |
| 4,599,732 | 7/1986 | Le Fever | 375/13 |
| 4,621,366 | 11/1986 | Cain et al. | 375/106 |
| 4,709,374 | 11/1987 | Farrow | 375/39 |

Primary Examiner—Stephen Chin
Attorney, Agent, or Firm—Volpe and Koenig

[57] ABSTRACT

A digital wireless subscriber telephone unit for wireless communication with a base station. An IF is used within the subscriber unit and base station which is combined with a carrier signal generated by a synthesizer for RF transmission between stations. In intervals between actuation of the system, a training mode is used wherein a known training signal is compared with a known values to produce correction coefficients to compensate for undesirable variations in timing and/or frequency, these constants being stored for use in correcting actual received signals. During demodulation, the modulated digital signals are fed to the modem processor in the form of time multiplexed I and Q samples and are de-multiplexed. The demultiplexed I and Q samples are fed to an equalizer and frequency correction circuit for minimization of errors for production of a frequency correction signal based upon the correction coefficients which is used to correct any errors in the timing and frequency of the system.

22 Claims, 5 Drawing Sheets

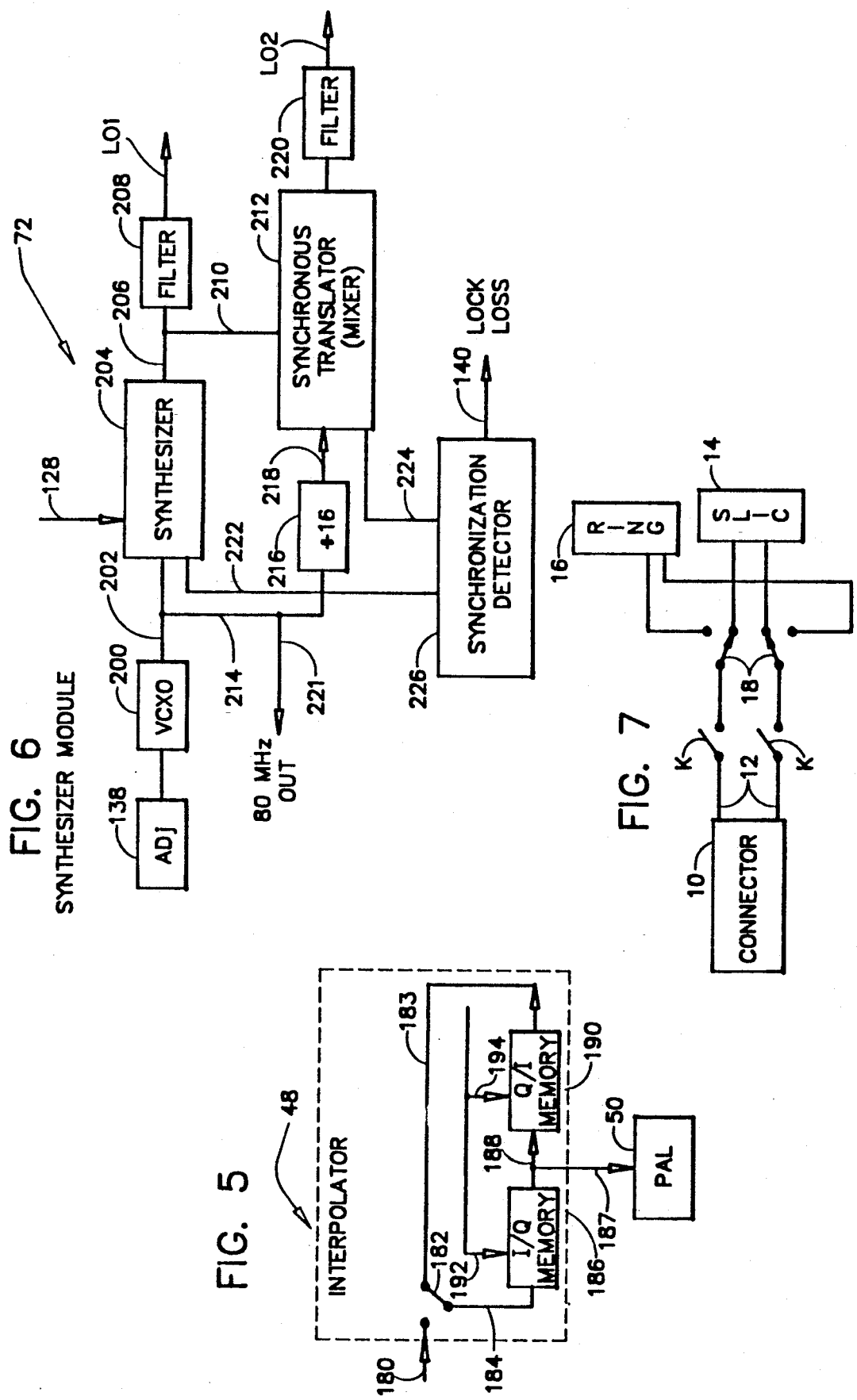

AUTOMATIC ADAPTIVE EQUALIZER

This is a continuation of application Ser. No. 07/256,557, filed Oct. 12, 1988, U.S. Pat. No. 4,881,240 which is itself a division of application Ser. No. 06/893,916, filed Aug. 7, 1986 now issued as U.S. Pat. No. 4,825,448, dated Apr. 25, 1989.

SUMMARY OF THE INVENTION

This invention provides a subscriber system unit for a digital wireless telephone system wherein the subscriber unit is adapted to be in wireless connection with a base station. The subscriber unit has a baseband processor which performs a number of functions including the transcoding of incoming and outgoing signals from one type of bit stream to another and the provision of echo cancellation. It also acts as a control microprocessor such as, for example, by informing a synthesizer in the system as to the desired operational frequency to be used. It is, in addition, coupled to storage means for receiving and storing the various functions performed or received thereby.

The baseband processor is connected to a modem processor to which it is coupled by a direct access means that prevents simultaneous access by both of these processors, but the two processors do communicate with each other, and the modem processor, which acts as the master in the system, may access the baseband processor's memory through the direct access means. However, lock-out means are provided whereby, in certain circumstances, control of the baseband processor by the modem processor is prevented.

The modem processor sends its signals, at a predetermined sampling rate, through a frequency translator which produces a time multiplexed frequency translated complex signal which is converted to an analog signal. This analog signal is subjected to deglitching by means of a blanking process. The deglitched signal is then upconverted and filtered to form an IF signal which is thereafter amplified. The frequency of the amplified IF signal is added to a frequency generated by the aforesaid synthesizer and the resultant RF signal is amplified and passed to an antenna.

The subscriber unit utilizes continuously repetative frames in which it transmits during one portion of each frame and receives during another portion thereof, these portions being designated "slots". On the basis of certain signals received from the base station, the baseband processor produces initiating signals which determine whether the subscriber unit will be in the transmit mode or the receive mode.

In intervals between actuation of the system, a training mode is used wherein a known signal from the modem processor is compared with a looped-back signal to produce correction constants to compensate for undesirable variations in the IF signal due to variations in temperature, component values, etc. are obtained. These correction constants are stored for use in correcting actual received signals.

During the demodulation, the modulated digital signals are fed to the modem processor in the form of time multiplexed I and Q samples and are demultiplexed. The demultiplexed I and Q samples are fed to an equalizer and frequency correction circuit for minimization of errors, resulting in the production of frequency correction signals which are used to correct any errors in the timing of the system and in the output of the synthesizer.

BRIEF DESCRIPTION OF THE DRAWINGS

FIG. 5 is a block diagram of the interpolator shown in FIG. 1.

FIG. 6 is a block diagram of the synthesizer shown in FIG. 1.

FIG. 7 is a modified form of the input portion of the system shown in FIG. 1.

GLOSSARY

Glossary of acronyms and words used in the Specification

| ACRONYM | DEFINITION |
|---|---|
| A/D | Analog-to-Digital Converter |
| ADJ | Adjustment Input |
| AFC | Automatic Frequency Control |
| AGC | Automatic Gain Control |
| BLANKING | Control means for causing a signal to be held at a predetermined amplitude level during actuation of the control means |
| CODEC | Cobined Coder and Decoder |
| CPE | Customer Provided Equipment (telephone instrument) |
| D/A | Digital-to-Analog Converter |
| DMA | Direct Memory Access |
| DPSK | Differential Phase Shift Keying Modulation |
| DS | Data Select |
| EEPROM | Electrically Erasable Programable Read Only Memory |
| EPROM | Erasable Programable Read Only Memory |
| FIFO | First-In First-Out Memory |
| FIR | Finite Impulse Response |
| GLITCH | Undersired Transient Signal |
| HOLD | Idle Mode |
| I | In-Phase |
| IF | Intermediate Frequency |
| Kbps | Kilobits per second |
| nS | Nanosecond |
| PAL | Programable Array Logic |
| PCM | Pulse Code Modulation |
| PROM | Programable Read Only Memory |
| PSK | Phase Shift Keying Modulation |
| Q | Quadrature |
| RAM | Random Access Memory |
| RELP | Residual Excited Linear Prediction |
| RF | Radio Frequency |
| R/W | Read/Write |
| S/H | Sample and Hold |
| SLIC | Subscriber Loop Interface Circuit |
| STROBE | Sampling Signal |
| UART | Universal Asynchronous Receiver Transmitter |
| VCXO | Voltage Controlled Crystal Oscillator |
| XF | External Flag Output Used for Signalling Other Processors |

This invention relates to communications systems for the wireless transmission of multiple information signals utilizing digital time division circuits between a base station and one or more subscriber stations, and it particularly relates to the structure and functioning of such a subscriber station.

The present invention pertains to the same general type of communication system as is disclosed in copending U.S. Pat. application Ser. No. 713,923, filed Mar. 20, 1985, and U.S. Pat. application Ser. No. 713,925, filed Mar. 20, 1985, both of these applications being incorporated herein by reference.

Figure 1:
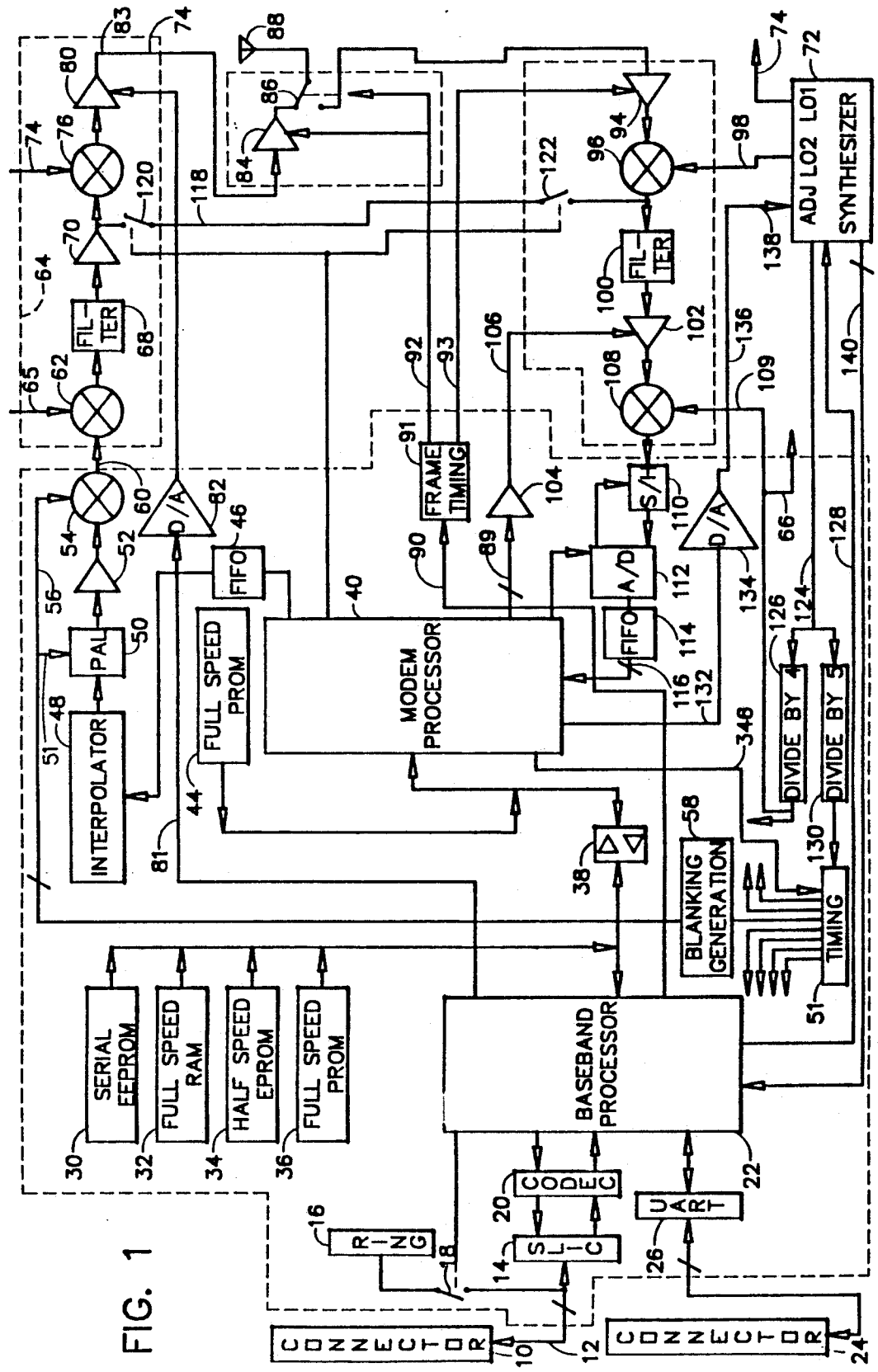
FIG. 1 is a diagramatic view showing a Subscriber Unit embodying the present invention.

Referring now in greater detail to the drawings wherein similar reference characters refer to similar parts, there is shown in FIG. 1 a connector 10 for connection to the customer-provided equipment (CPE). A line pair 12 leads from the connector 10 to a SLIC 14 and is also connectable to a ringer circuit 16 through a relay 18. The SLIC 14 is a standard chip for providing various functions such as battery voltage, overvoltage protection, ringing, signalling detection, as from a rotary dial, the handset status, line testing, etc.. It also contains the hybrid which separates a plurality of voices into ingoing and outgoing signals. The SLIC 14 is coupled to a codec 20 having ingoing and outgoing lines to and from a baseband processor 22 whereby in the ingoing direction it converts analog voice signals to digital signals, i.e., 64 kbps u-law PCM, while in the outgoing direction, it converts the digital signals to analog voice signals. There is an alternative access to the baseband processor through a connector 24 and a UART 26, which provides a direct digital connection to the baseband processor, thereby bypassing the SLIC and codec. This direct access connection serves two purposes: (1) to pass only digital signals, when so desired, thereby bypassing all analog connections, and (2) to allow direct access to the processors and memories for easy maintenance and test purposes.

The baseband processor 22 has several functions, one of which is to convert the 64 kbps PCM signal to 14.57 ... kbps by means of a transcoding function, such as, for example, provided by residual excited linear prediction (RELP). It also provides echo cancellation, and, in addition, acts like a control microprocessor, as, for example, by informing the synthesizer used in the system as to the desired operational frequency. The baseband processor 22 is coupled to a serial EEPROM 30, which is an electrically erasable, non-volatile memory where selected bits may be electrically modified without erasing other bits stored therein. This EEPROM 30 is used to store both the subscriber identification number and the network indentification number (the base station with which it is used). In addition, the baseband processor 22 is coupled to a full speed RAM 32 in which it stores the signals received therein. The RAM 32 also includes a "cache" means, and, in addition, is used as a random access memory for RELP conversion, echo cancellation and other control functions. The baseband processor 22 is also coupled to a half-speed EPROM 34 and a full-speed PROM 36 which store the RELP and echo cancellation functions as well as various other functions such as the control function. The baseband processor 22 is, in addition, coupled via direct memory access (DMA) 38 to a modem processor 40.

The DMA 38 prevents the occurrence of simultaneous access of RAM 32 by both the baseband and modem processors.

The DMA interface is used to transfer voice and control data between the baseband and modem processors. The modem processor 40 acts as the master and controls the baseband processor 22 via hold lines (not shown). The modem processor 40 has the capability to access the baseband processor 22, halt its processing and cause the control lines, address and the data buses to assume the high impedance state of a three-state output. This permits the modem processor 40 to access the baseband processor's DMA memory through the DMA Interface and read or write to it.

This is accomplished by the modem processor 40 asserting its XF bit, which is gated to the baseband processor's Hold input. When the baseband processor receives this command, it will finish executing the current instruction, stop its processing, cause its control, data and address busses to assume the high impedance state of a three-state output and then issue a Hold Acknowledge signal back to the modem processor. Immediately after the modem processor issues the Hold command, it will continue on with other tasks while waiting for the baseband processor to send the Hold Acknowledge signal. Once the modem processor receives the Hold Acknowledge signal, it will take control of the baseband processor's control, data, and address buses and then read or write to the DMA RAM 32. After the modem processor completes accessing the DMA RAM, it will take away the Hold input on the baseband processor, which will then resume processing where it left off. The baseband processor also has the capability to lock out the modem processor by setting its own XF bit high.; This bit is gated with the Hold from the modem processor and can override the Hold line at any point before the baseband processor goes into the Hold state. The modem processor uses 10 bits of the address bus and all 16 bits of the data bus. It also uses three control lines: Strobe, R/W, and DS.

Either the baseband processor 22 or the modem processor 40, acting in either direction, may obtain signals from the RAM 32 in accordance with the signals described above. The two processors communicate with each other by way of a portion of RAM 32 that is set aside to be used as a cache. The modem processor 40 is also coupled to a full speed PROM 44 which contains the program for this processor.

The modem processor 40, in its modulation mode, sends its signals via a FIFO 46 to an interpolator 48, these signals being at a sampling rate of 320 kHz. The interpolator 48 effectively increases this sampling rate by to convert it to 1600 kilosamples/second (1.6 megasamples/second). The interpolator, in conjunction with the crystal filter (herein after described), which acts as an integrator, effectively approximates a 5 tap FIR filter. This usage of digital and analog hardware to implement an FIR filter differs from the classic all digital hardware FIR implementation. The interpolator output is fed into a PAL 50.

The PAL is configured as a type of mixer into which is fed a 400 kHz square wave, as indicated at 50, which comes from a timing generator 51, as well as the 1600 kilosample/second signal. The 1600 kilosample/second signal represents a 16-kilosymbol/second PSK signal with a zero carrier and a desired 20 kHz bandwidth. In effect, the PAL can be considered as a frequency translator. The PAL circuit which when configured to perform a 2's complement function controlled by a 400 kHz square wave effectively performs a time multiplexed quadrature mixing and effectively translates the 20 kHz wide baseband signal up to 400 kHz.

The output from the PAL 50 is a time multiplexed, frequency translated complex signal which is passed to the D/A converter 52 which converts the digital signal into an analog signal. The output from the D/A converter 52 is fed to a mixer 54 into which is also fed a deglitching/blanking pulse 56 from a blanking generation module 58. Glitch energy is a major contribution to noise in a sampled data system. Glitch energy occurs during transitions from one input word to another. In a D/A converter, each incoming bit, depending upon its state, may cause a change in output analog level. Such changes resulting from the various bits usually do not occur simultaneously and therefore cause glitches. Classical solutions to this problem are the use of a sample and hold following the D/A or the use of a de-glitching D/A. Both of these alternatives, however, are unduly expensive. "Blanking" returns the output of the mixer to an intermediate reference level during the transition periods, typically about 35 nS before and 130 nS after the digital switching times, thereby suppressing large glitch spikes that occur on the D/A output. Although blanking creates harmonics away from the center frequency of interest, the use of relatively tight IF filtering substantially removes these harmonics. This blanking method also reduces the sampling rate content in the output.

The output from mixer 54, indicated at 60, is fed to a mixer 62 in an upconverter, generally designated 64. The mixer 62 has a 20 MHz input indicated at 65, which is common with a 20 MHz line 66. The output of mixer 62 is the sum of 20 MHz from input 65 and the 400 kHz signal received from mixer 54, with a resultant output of 20.4 MHz. This output is fed into a crystal filter 68 which passes only this sum, constituting the IF signal, to an amplifier 70.

A synthesizer is shown at 72. Within this synthesizer 72 is a synthesizer module of the type shown in U.S. Pat. application Ser. No. 840,908 filed Mar. 18, 1986, which provides an output L01. Also within the synthesizer module, a second circuit derives a second output L02 wherein the output of L02 tracks the output of L01 at a frequency of 5 MHz below the frequency of L01. The synthesizer uses as a reference the 80 MHz VCXO. The output L01 is fed through line 74 to a mixer 76 which also receives the IF output from amplifier 70. Since the IF signal has a value of 20.4 MHz, if, for example, a frequency of 455.5 MHz is desired at the output of mixer 76, the synthesizer is operated to generate a frequency of 435.1 MHz, which when added to the 20.4 MHz, gives the desired frequency of 455.5 MHz. This output is then amplified by a variable gain amplifier 80. The baseband processor 22, on the basis of decoding certain signals from the base station, sends a gain control signal on line 81, through a D/A converter 82, to the variable gain amplifier 80. Variable gain amplifier 80 has limited bandwidth and, therefore, does not pass the undesired difference frequency also produced by the mixer 76. The output of amplifier 80 is passed through line 83 to a power amplifier 84, which accomplishes the final amplification before the RF signal passes through a relay 86 to an antenna 88.

The unit employs a system whereby a frame repeats every 45 milliseconds. In this system, the unit transmits during a portion of the second half of each frame and receives during a portion of the first half of the frame. One configuration might be where both portions of the half are of equal length (although they may not neccessarily be equal). Another configuration (16-ary) might be where four equal length portions are available to the subscriber during an entire frame. Each of the four portions may be termed a slot. Each slot contains, as part of its initial data, a unique word which is used by the unit to establish timing for reception of the remaining data in the slot. The first slot of the four may be preceded by an AM hole which is used to determine a slot arbitrarily designated by the base station as the first slot. The AM hole and the unique word are part of the incoming signal from the base station. The duration of the AM hole is used to determine whether a particular RF channel is a control channel or a voice channel.

A data signal is derived from the average magnitude of the signal represented at 116. A threshold proportional to said average magnitude is compared to unaveraged magnitudes. If the threshold is not exceeded by said unaveraged magnitude for a predetermined period of time, it is assumed that an AM hole has been detected. The modem processor 40 stores the time at which the AM hole was determined to occur in RAM 32. The baseband processor, on the basis of (a) modulation mode (4-ary or 16-ary), (b) the time at which an AM hole occurred, as stored in RAM 32, and (c) the time at which a unique word was received, as separately determined by the baseband processor, produces initiating signals which indicate when the unit should be in a transmit mode or a receive mode. Such initiating signals are coupled via line 90 to frame timing module 91.

The frame timing module 91 converts the initiating signals into two series of pulses. One series of pulses is connected via line 92 to enable power amplifier 84 and to actuate switch 86 so as to connect the output of amplifier 84 to antenna 88. During the period of the pulse on line 92, the unit is designated to he in the transmit mode. When switch 86 is not so actuated, it is configured to connect antenna 88 to the input of a low noise amplifier 94.

The other series of pulses from frame timing module 91 are connected via line 93 to the amplifier 94 to enable this amplifier. The unit is designated to be in the receive mode during this series of pulses. The preamplifier 94 passes received signals to a mixer 96, which also receives output L02 from the synthesizer 72 through line 98. The output of mixer 96 is fed to a crystal filter 100, the output of which, in turn, is fed to an IF amplifier 102.

The modem processor 40 passes via line 89, the aforementioned data signal, which is derived from the average magnitude of the signal represented at 116, to a D/A converter 104 which produces an analog AGC voltage signal which passes through line 106 to amplifier 102, thereby indicating to this amplifier how much gain is required in order to compensate so that the IF signal is always at the same amplitude. This amplifier also receives the output from crystal filter 100. The output from amplifier 102 passes to a mixer 108 into which is also applied an input of 20 MHz from line 109 to produce a resultant 400 kHz signal. This 400 kHz signal is then passed to an A/D module which consists of sample and hold circuits 110, and A/D converter 112 and a FIFO 114.

The output from the A/D conversion module is 64 kilosamples/second and this output is fed through line 116 into the modem processor 40. The modem processor 40 demodulates this signal and passes the demodulated data into the cache portion of RAM 32 which is accessed by the baseband processor 22 in which the RELP conversion takes place. The resultant output has 64 kbps PCM on a continuous serial basis. This output is fed to the codec, which converts it to an analog signal that is then fed to the SLIC which, in turn, feeds it to the telephone instrument; or, alternatively, the 16 kbps from the cache can be decoded into a digital signal which is fed to the UART 26.

When used in the training mode, a loopback is provided at 118 between two switches 120 and 122. This loopback, which is at the IF side rather than at the RF side, decreases the number of elements required The training mode is that in which a known signal is sent out by the modem processor through the remainder of the transmitter elements set to IF amplifier 70. Because switches 120 and 122 are operated, the output of the amplifier 70 is connected to the input of crystal filter 100.

Additionally, an output of the baseband processor 22, indicated line 90, fuses to frame timing 91 and causes a pulse on line 93 to totally disable amplifier 94 during the training mode. Furthermore, during the training mode, frame timing 91 produces another pulse on line 92 which totally disables amplifier 84. The known signal generated by the modulator is compared with the actual signal returned to the demodulator A subsidiary program is then set up to compensate for variations due to various factors such as variations in temperature, component values, etc.. The correction constants are stored in the RAM 32. The modem applies these stored corrections to the received signals. The training mode takes place in intervals between actuation of the system.

The synthesizer module 72 contains an 80 MHz oscillator (VCXO) derived from the received signal. The 80 MHz signal generated by the oscillator goes through line 124 to a divide-by-4 circuit 126, the output of which goes to mixers 62 and 108. This output also goes to the two processors to provide clock pulses (square waves). In addition, it goes through line 124 to a divide-by-5 circuit 130 and then to timing module 51 The modem processor determines any difference in frequency between the center frequency of the input signal and a submultiple of the clock frequency.

Any resulting difference is applied by the modem processor, via line 132, to a D/A converter 134. The output of the D/A converter 134 is applied via line 136 an ADJ input 138 to the VCXO (hereinafter described) in such a manner as to change its frequency in the direction required to minimize the preceeding resulting difference. A lock loss detector signal is applied through line 140 to the baseband processor 22 to indicate when there is a loss of synchronization in the synthesizer.

Figure 2:
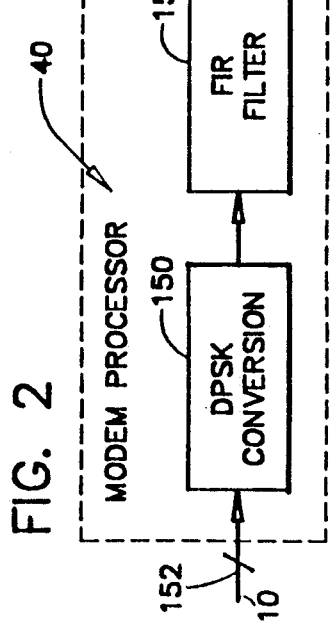
FIG. 2 is a block diagram of the modulator portion of the modem processor shown in FIG. 1.

The modem processor 40, as shown in FIG. 2, comprises a DPSK converter 150 into which data is fed through line 152. The data is then fed at 16 kHz symbol/second rate, to a FIR filter 154. The output from FIR filter 154, indicated at 156, is asynchronous data comprising 10 complex samples/symbol, time-multiplexed IQ pairs. This output is fed to the FIFO 46, described above, where asynchronous to synchronous conversion takes place. The output from the FIFO 46, in the form of 160,000 pairs of data words/second, is fed into the interpolator 48, described above, which demultiplexes the IQ pairs, and remultiplexes the IQ samples at a 1.6 MHz rate.

In a 16-ary modulation scheme, the binary input sequence is divided up into 4-bit symbols. In 16-ary PSK, the 4-bit symbols determine the phase of the carrier during the given symbol period. The task of converting the binary input to the PSK waveform is performed by the modulator.

Figure 3:
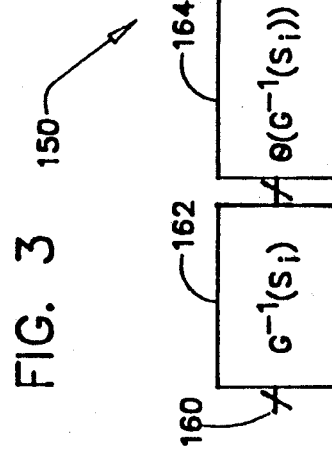
FIG. 3 is a block diagram of the DPSK conversion unit shown in FIG. 2.

FIG. 3 shows how a sequence of samples ($S_i$), shown at 160, is transformed into a sequence of In-Phase (I) and Quadrature (Q) samples in the DPSK converter 150 of the modem processor 40. The symbols are first inverse Gray encoded, as shown at 162. This is done to minimize the number of bit errors that occur due to the most likely incorrect symbol decisions in the demodulator.

The output of the inverse Gray encoder 162 is fed into a phase quantizer 164 which determines the absolute phase value $\theta_i$ introduced by the current symbol. This phase value is then fed into the differential encoder 166 which computes the absolute phase value $\theta'_i$. $\theta'_i$ represents the modulo 16 sum of the current differential phase $\theta_i$ and the previous phase $\theta'_{i-1}$.

$$\theta'_i = (\theta_i + \theta'_{i-1}) \bmod 16$$

The modulo 16 addition corresponds to the modulo 360 addition that is performed when adding angles.

The differential phase $\theta'_i$ is fed into cosine and sine lookup tables to compute the I and Q components of the current symbol.

Figure 4:
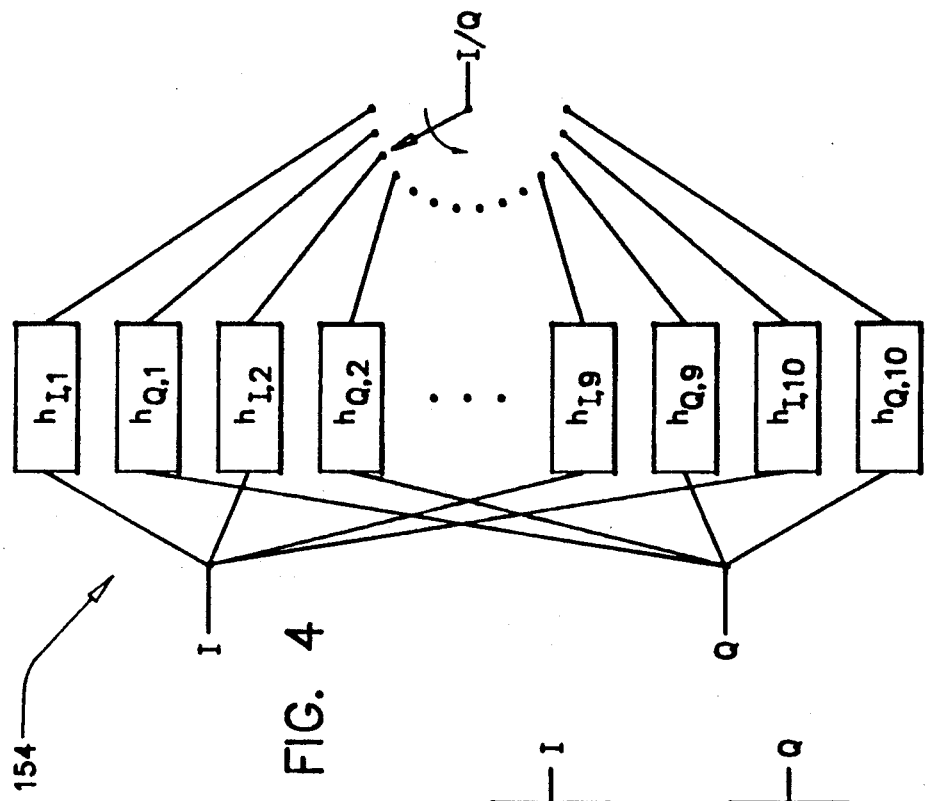
FIG. 4 illustrates the structure and function of the FIR filter shown in FIG. 2.

The I and Q samples are fed into the 6-tap Finite Impulse Response (FIR) filter 154 shown more specifically in FIG. 4. The function of the FIR filter is to create an oversampled PSK waveform from the I and Q samples. The I samples are fed into a bank of ten 6-tap FIR filters labeled "$h_j$" (j=1 through 10). Similarly, the Q samples are fed into a bank of ten filters labeled "$h_{Qj}$". The outputs of these 20 filters are time division multiplexed as shown onto a single parallel bus that runs at a sampling rate which is ten times the sampling rate of the I,Q pairs at the input of the filter.

The interpolator 48, shown more specifically in FIG. 5, comprises an input 180 and a switch 182 that is connected to the I/Q memory 186 by a line 184, the switch 182 being switchable between the input 180 and a line 183. The output of the I/Q memory 186 is connected to the PAL 50 by the line 187 and to the Q/I memory 190 by the line 188. Line 183 is connected to the output of the Q/I memory 190. A 1.6 MHz input is provided for both the I/Q and Q/I memories as indicated at 192 and 194 respectively. The interpolator demultiplexes the multiplexed I,Q samples at a 160 kHz rate and then resamples and remultiplexes at an 800 kHz rate.

The synthesizer 72, functionally described above, is illustrated in FIG. 6, where there is shown an 80 MHz VCXO module 200 that receives a signal from the ADJ input 138. This input controls the exact frequency of the VCXO module. The output from the VCXO module is connected via line 202 to the synthesizer 204, which as stated above is of the type shown in U.S. Pat. application Ser. No. 840,908. This synthesizer 204 is capable of synthesizing frequencies between 438.625 and 439.65 MHz in appropriate synchronism with the signals over line 202. The particular frequency is selected by an input signal over line 128 (also shown in FIG. 1).

The output of the synthesizer 204 is fed, via line 206 and filter 208 to become L01. The output of synthesizer 204 is also fed, via line 210, to a synchronous translator 212. The output of the VCXO 200 is fed through line 214 to a divide by 16 module 216, the 5 MHz output of which is fed through line 218 to the synchronous translator module 212. The output on line 214 is also connected to a reference output 221.

Module 212 subtracts the 5 MHz input from line 218 from the frequency on line 210, producing a difference frequency that is fed, via filter 220, to become L02. In this manner, the frequencies appearing as L02 vary between 433.625 and 434.65 MHz, whereby the frequency of the L02 is always 5 MHz below the frequency of L01.

Additionally, the output from the synthesizer 204, via line 222, and the output from the synchronous translator 212, via line 224, are combined in a synchronization detector 226 in such manner that if either the frequency on line 206 is not synchronous with the frequency on line 202 or the frequency output of synchronous translator 212 is not synchronous with the combination of the frequency on line 206 and the output frequency of the divide-by-16 module 216, a loss of synchronization (lock loss) signal is sent on line 140 (also shown in FIG. 1).

The particular combination of one synthesizer 204 plus the divide-by-16 module 216 and the synchronous translator 212 provides the same function as the two separate synthesizers previously used, but with fewer parts, greater stability, easier tolerances, etc.

FIG. 7 illustrates a preferred circuit to test the customer interface. In this respect, the baseband processor 22 (shown in FIG. 1) digitally generates a 1 kHz sine wave that is passed to the codec 20 (shown in FIG. 1) that converts it to an analog sine wave which is, in turn, passed through the hybrid function of the SLIC 14 to line pair 12. A relay K (not shown in FIG. 1) is inserted immediately adjacent the connector 10 so that it may disconnect the connector from the circuit Any reflected signal from the unterminated line pair 12 at the open relay K is returned through the hybrid function of the SLIC and is converted to a digital signal by the codec 20. This digital signal is fed to the baseband processor 22 which compares the reflected signal with the originating signal and determines whether any undesired impedances or connections, e.g. grounds, are present on the line pair 12.

Figure 8:
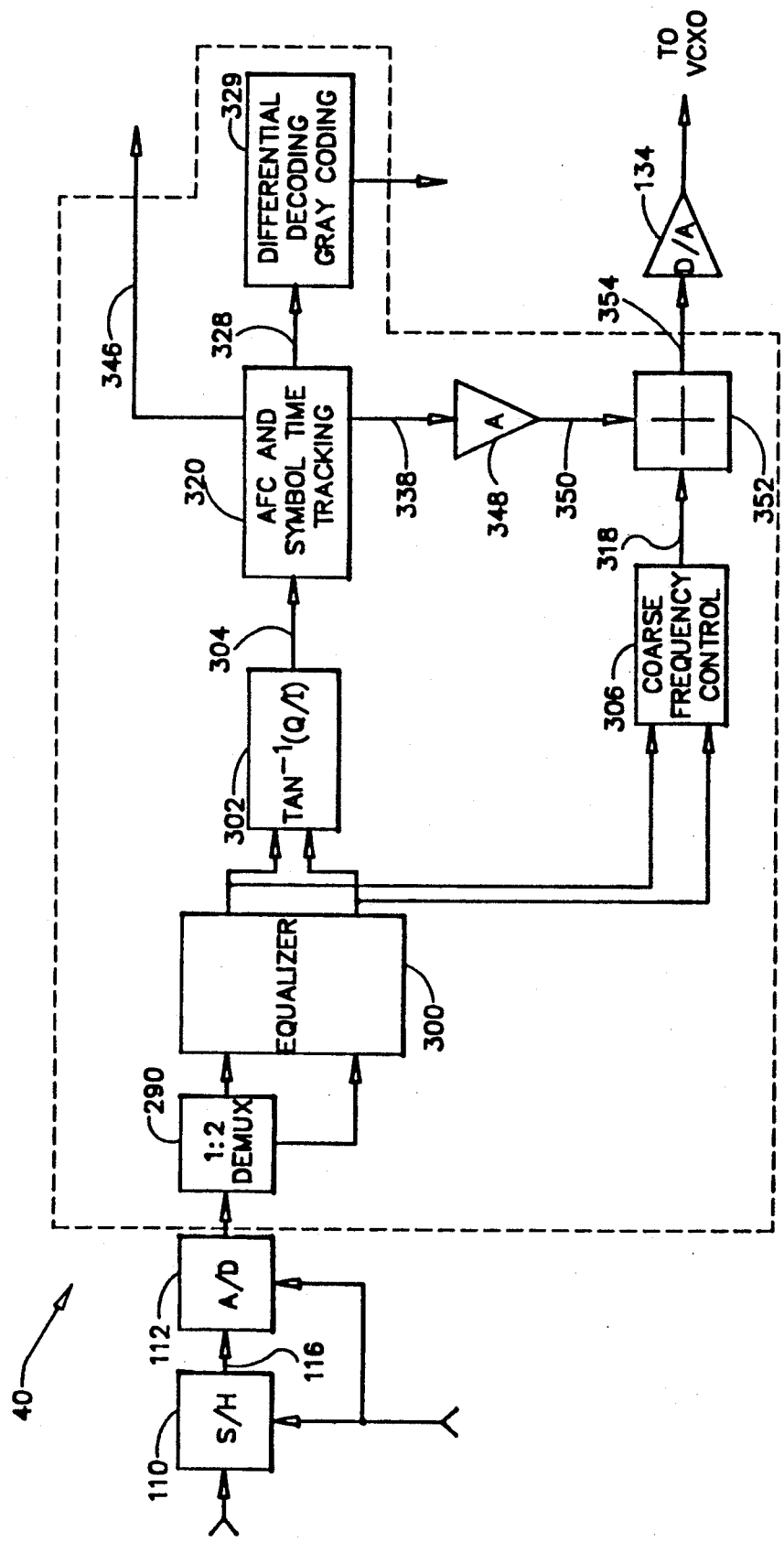
FIG. 8 is a block diagram of the demodulator portion of the modem processor shown in FIG. 1.

FIG. 8 illustrates the demodulator portion of the modem processor 40 and shows the 400 kHz output from the mixer 108 (shown in FIG. 1) applied to the high precision sample and hold circuit 110, which has an aperture uncertainty of 25 nanoseconds or less, the output of which is passed to the A/D converter 112. The output of A/D converter 112 is fed through line 116 to the modem processor (all as shown in FIG. 1). The input at line 116 comprises time multiplexed I and Q samples (which may have some cross-product distortion) in the form of two complex sample pairs/symbol. Said time multiplexed I and Q samples are applied to the demultiplexer 290 where they are demultiplexed. The demultiplexed I and Q samples are applied to an equalizer module 300 whose objectives are to minimize (a) error energy of the received data stream, (b) modified error energy of the data stream delayed by 0.05 T (T being 1/16000 of a second), (c) modified error energy of the data stream advanced by 0.05 T, (d) energy of the data stream from the adjacent upper channel (desired receive frequency plus 25 kHz), and (e) energy from the data stream of the adjacent lower channel (desired receive frequency minus 25 kHz).

The equalizer is a complex 28 tap FIR filter wherein the filter weights are determined by minimizing the above five objectives. For this purpose, five training signals are generated by the modulator. These are: (a) a signal at the desired frequency wherein the receiver and transmitter clocks are synchronized, (b) the same signal as (a) but wherein the receiver clock is advanced with respect to the transmitter clock by 0.05 T, (c) the same signal as (b) except that it is delayed by 0.05 T, (d) the same signal as (a) but wherein the carrier frequency is increased by 25 kHz, and (e) the same signal as (d) except that the carrier frequency is decreased by 25 kHz. In cases (d) and (e), to create the training signal with a 25 kHz deviation, the modem processor modifies the transmit FIR filter coefficients in order to shift the filter center frequency by 25 kHz.

By comparing the actual inputs during the presentations of each of the five training signals with a set of desired outputs, a set of weighting coefficients is obtained, which when implemented in the equalizer, achieve the aforementioned objectives. These weighting coefficients are stored in the modem processor 40.

The equalized I and Q samples are fed into a module 302 which produces an output which is the arc tangent of the ratio of the equalized Q and I samples. This output, shown at 304, represents the phase of the received signal.

Figure 9:
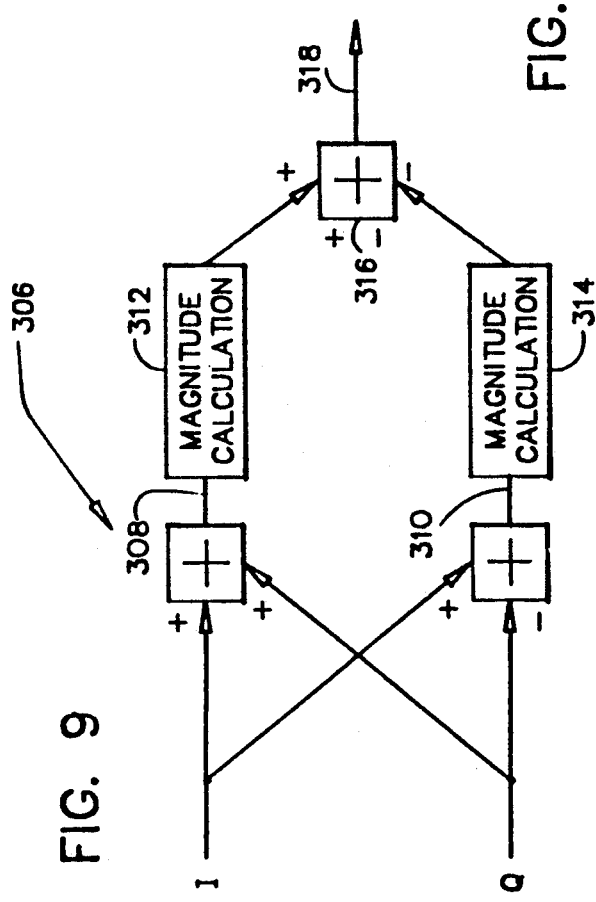
FIG. 9 is a block diagram of the course frequency control module shown in FIG. 8.

The equalized I and Q samples are also simultaneously fed to a course frequency module 306, shown in greater detail in FIG. 9. The I and Q samples are summed to produce a lower sideband 308 (as shown in FIG. 9), and simultaneously the difference between the I and Q samples is formed to produce an upper sideband 310. A magnitude calculation is then performed on both the upper and lower sidebands, as indicated at 312 and 314. The difference operation between the magnitudes take place at 316. This difference indicated at 318, represents a frequency error.

Figure 10:
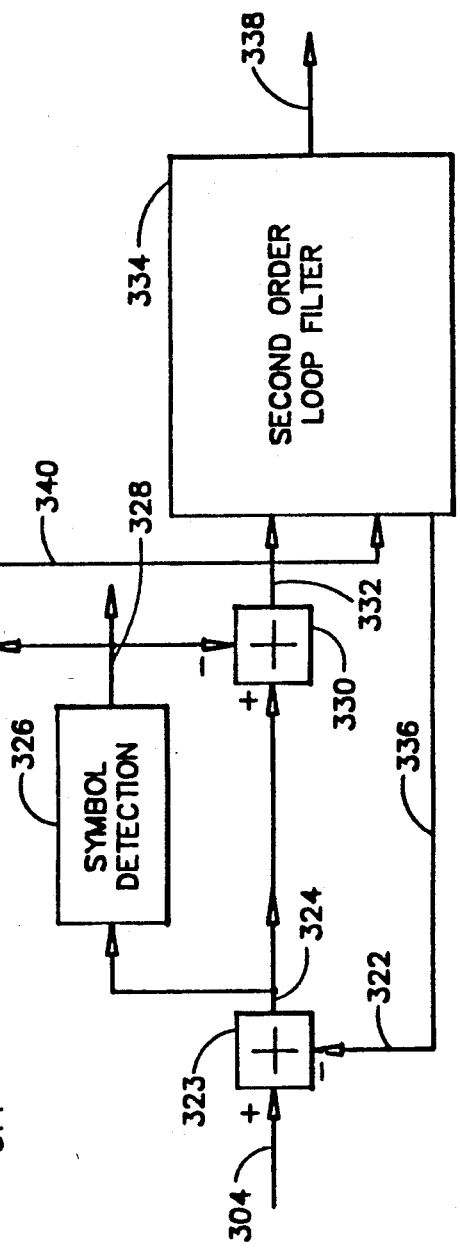
FIG. 10 is a block diagram of the AFC and symbol timing module shown in FIG. 8.

As shown in FIG. 8, the output 304 of the arc tangent module 302 is fed to the AFC and symbol time tracking module 320 (which is shown in greater detail in FIG. 10). The phase correction value, indicated at 322 in FIG. 10, is subtracted from the detected phase 304, resulting in the corrected phase indicated at line 324. The corrected phase 324 is fed into a symbol detector 326 which detects the current symbol in terms of the phase value and quantizes the phase to the nearest 22.5 degree increment. The quantized phase, indicated at 328, is subtracted from the corrected phase 324 at 330. This results in the phase error signal indicated at 332. This error signal 332 is fed into a second order loop filter, generally indicated at 334, which computes the phase correction value, indicated at line 336, as well as the frequency correction signal, shown at 338. This frequency correction signal is applied to the VCXO through line 132 shown in FIG. 1.

The error signal 332 is fed through line 340 to a symbol timing tracking module 342 which also receives the output from the symbol detection module 326 through line 344. The symbol timing tracking module 342 contains an algorithm which tracks the phase over a number of predetermined symbols, looking at the starting phase of the first symbol and the phase of the last symbol, and then determines the slope. It tries to determine from the phase versus time function where the zero crossings occur. By looking at the zero crossings that actually occurred and comparing them with where they should have occurred, a timing adjustment is computed that will correct for the difference. The symbol clock will be adjusted at the beginning of the next slot. The symbol timing tracking module 342 provides an output 346 which is applied to the timing module 51 (shown in FIG. 1).

The frequency correction signal 338 from the AFC and symbol timing module 320 is applied to a weighting module 348 (as shown in FIG. 8) where it is weighted. The output 350 from module 348 is fed into a summing module 352 where signal 350 is summed with the output 318 of module 306 to provide an output 354 which is applied to the D/A converter 134. The output from D/A converter is shown in FIG. 1 as being applied to the synthesizer at 138.

Although the invention, as described above, provides for various separate elements, it is possible to include the functions of many of these elements such as, for example, the full speed PROM 44, the FIFO 46, the interpolator 48 and the PAL 50, within a modem processor of sufficiently large capacity. This may also be true of such elements as the frame timing 91, the blanking generation 58, the timing means 51, the divide-by-4, the divide-by-5 and some or all of the synthesizer 72. Furthermore, the baseband processor and the modem processor may also be combined in a simple unit which may also include the codec and the UART.

We claim:

1. An equalizer circuit for a wireless digital telephone network comprising:
   a FIR filter for I and O samples of an information carrying signal;
   means to apply I and Q samples to said FIR filter;
   detection means for applying a plurality of training signals to said FIR filter, said training signals corresponding to undesirable characteristics possibly present in the I and Q samples, said training signals include a signal at a desired frequency and at least one signal which is offset from said desired frequency;
   means for comparing the actual I and Q samples with a set of desired outputs during the presentations of said training signals to obtain a set of weighting coefficients; and
   frequency correction means responsive to the resultant weighting coefficients for correcting the frequency of the information carrying signal.

2. An equalizer circuit for a wireless digital telephone network according to claim 1 wherein said training signals include a signal at a desired frequency and sampling rate of 1/T samples per second and at least one signal which is offset in time.

3. An equalizer circuit for a wireless digital telephone network according to claim 2 wherein said training signals include signals which are advanced and signals which are retarded in time.

4. An equalizer circuit for a wireless digital telephone network according to claim 3 wherein the advance and retardation of the respective signals is 0.05 T.

5. An equalizer circuit for a wireless digital telephone network according to claim 1 wherein said training signals include signals which are increased and signals which are decreased in frequency from said desired frequency.

6. An equalizer circuit for a wireless digital telephone network according to claim 5 wherein the increase and decrease of the respective signals is 25 kHz.

7. An equalizer circuit for a wireless digital telephone network according to claim 1 wherein said training signals include a signal at a desired frequency and sampling rate of 1/T samples per second, at least one signal which is offset in time, and at least one signal which is offset from said desired frequency.

8. An equalizer circuit for a wireless digital telephone network according to claim 7 wherein:
   said training signals include signals which are advanced and signals which are retarded in time; and
   said training signals include signals which are increased and signals which are decreased in frequency from said desired frequency.

9. An equalizer circuit for a wireless digital telephone network according to claim 8 wherein the advance and retardation of the respective offset time signals is 0.05 T and the increase and decrease of the respective offset frequency signal is 25 kHz.

10. An equalizer circuit for a wireless digital telephone network according to claim 1 wherein said training signals are generated in a common equipment set with the equalizer circuit.

11. An equalizer circuit for a wireless digital telephone network according to claim 10 wherein said training signals include signals which are increased and signals which are decreased in frequency from said desired frequency.

12. An equalizer circuit for a wireless digital telephone network according to claim 11 wherein the increase and decrease of the respective signals is 25 kHz.

13. An equalizer circuit for a wireless digital telephone network according to claim 10 wherein said training signals include a signal at a desired frequency and sampling rate of 1/T samples per second, at least one signal which is offset in time, and at least one signal which is offset from said desired frequency.

14. An equalizer circuit for a wireless digital telephone network according to claim 13 wherein:
   said training signals include signals which are advanced and signals which are retarded in time; and
   said training signals include signals which are increased and signals which are decreased in frequency from said desired frequency.

15. An equalizer circuit for a wireless digital telephone network according to claim 14 wherein the advance and retardation of the respective offset time signals is 0.05T and the increase and decrease of the respective offset frequency signal is 25 kHz.

16. In a subscriber unite for a wireless digital telephone, an equalizer circuit comprising:
   an input for time multiplexed I and Q samples of an information carrying signal;
   means for applying said time multiplexed I and Q samples, in the form of complex sample pairs/symbol, to a demultiplexer;
   an equalizer coupled to said demultiplexer for receipt therefrom of the demultiplexed I and Q samples;
   frequency error detection means coupled to said equalizer to produce a frequency error signal;
   means for generating and applying training signals to said equalizer;
   means for comparing the actual inputs applied to said equalizer with a set of desired outputs during the presentations of said training signals to obtain a set of weighting coefficients; and
   frequency correction means coupled to said frequency error detection means to correct the frequency of the information carrying signal based upon said set of weighting coefficients.

17. A subscriber unit according to claim 16 wherein said training signals include a signal at a desired frequency and at least one signal which is offset from said desired frequency.

18. A subscriber unit according to claim 17 wherein said training signals include signals which are increased and signals which are decreased in frequency from said desired frequency.

19. A subscriber unit according to claim 18 wherein the increase and decrease of the respective signals is 25 kHz.

20. A subscriber unit according to claim 16 wherein said training signals include a signal at a desired frequency and sampling of 1/T samples per second, at least one signal which is offset in time, and at least one signal which is offset from said desired frequency.

21. A subscriber unit according to claim 20 wherein: said training signals include signals which are advanced and signals which are retarded in time; and said training signals include signals which are increased and signals which are decreased in frequency from said desired frequency.

22. A subscriber unit according to claim 21 wherein the advance and retardation of the respective offset time signals is 0.05T and the increase and decrease of the respective offset frequency signal is 25 kHz.

* * * * *

UNITED STATES PATENT AND TRADEMARK OFFICE
CERTIFICATE OF CORRECTION

PATENT NO. : 5,168,507          Page 1 of 2

DATED : December 1, 1992

INVENTOR(S) : Critchlow et al.

It is certified that error appears in the above-identified patent and that said Letters Patent is hereby corrected as shown below:

At column 4, line 47, after 'by' insert -- 5 --.

At column 6, line 32, delete "he" and insert therefor -- be --.

At column 7, line 22, after 'demodulator' insert -- . --;

line 36, after reference numeral '51' insert -- . --.

At column 8, line 28, delete "h ,j" and insert therefor -- $h_{I,j}$ --;

line 30, delete "$h_{Q'j}$" and insert therefor -- $h_{Q,j}$ --.

At column 9, line 29, after 'circuit' insert -- . --.

UNITED STATES PATENT AND TRADEMARK OFFICE
CERTIFICATE OF CORRECTION

PATENT NO. : 5,168,507
DATED : December 1, 1992
INVENTOR(S) : Critchlow et al

It is certified that error appears in the above-indentified patent and that said Letters Patent is hereby corrected as shown below:

Column 11, line 23, delete "O" and insert therefor --Q--

Column 12, line 42, delete "unite" and insert therefor --unit--

Signed and Sealed this

Sixteenth Day of November, 1993

Attest:

BRUCE LEHMAN

Attesting Officer                Commissioner of Patents and Trademarks